(12) United States Patent
Muthuraman

(10) Patent No.: US 10,411,730 B2
(45) Date of Patent: Sep. 10, 2019

(54) DATA COMPRESSION SYSTEM FOR STORING DATA FROM AN AUTOMATED VEHICLE

(71) Applicant: DELPHI TECHNOLOGIES IP LIMITED, St. Michael (BB)

(72) Inventor: Balasubramanian Muthuraman, Singapore (SG)

(73) Assignee: DELPHI TECHNOLOGIES IP LIMITED (BB)

( * ) Notice: Subject to any disclaimer, the term of this patent is extended or adjusted under 35 U.S.C. 154(b) by 114 days.

(21) Appl. No.: 15/490,367

(22) Filed: Apr. 18, 2017

(65) Prior Publication Data

US 2018/0302103 A1 Oct. 18, 2018

(51) Int. Cl.
*H03M 7/40* (2006.01)
*G06F 3/06* (2006.01)
*G06F 17/14* (2006.01)
*H03M 7/30* (2006.01)

(52) U.S. Cl.
CPC ........ *H03M 7/4006* (2013.01); *G06F 3/0628* (2013.01); *G06F 17/147* (2013.01); *H03M 7/30* (2013.01); *H03M 7/40* (2013.01)

(58) Field of Classification Search
None
See application file for complete search history.

(56) References Cited

U.S. PATENT DOCUMENTS

| | | | | |
|---|---|---|---|---|
| 5,675,382 A | * | 10/1997 | Bauchspies | H03M 7/42 358/1.9 |
| 8,126,283 B1 | * | 2/2012 | Garbacea | G06F 17/3079 375/240 |
| 2005/0193408 A1 | * | 9/2005 | Sull | G06F 17/30817 725/32 |
| 2012/0059804 A1 | | 3/2012 | Tapply et al. | |

FOREIGN PATENT DOCUMENTS

EP 2819412 A1 12/2014

* cited by examiner

*Primary Examiner* — Michael D. Yaary
(74) *Attorney, Agent, or Firm* — Joshua M. Haines

(57) ABSTRACT

A data-compression system for compressing and storing sampled data from an electronic control unit (ECU) in an automated vehicle includes an input and a controller. The input receives and samples a signal during a time-interval to provide a frame of sampled-data. The controller is in communication with the input. The controller is configured to capture the frame of sampled-data; determine an average-value of the sampled-data in the frame, and convert the sampled-data to percentage-data using the average-value as the basis for the conversion.

10 Claims, 3 Drawing Sheets

DATA COMPRESSION SYSTEM FOR STORING DATA FROM AN AUTOMATED VEHICLE

TECHNICAL FIELD OF INVENTION

This disclosure generally relates to a data-compression system, and more particularly relates to a system that determines an average-value of sampled-data, and converts the sampled-data to percentage-data using the average-value as the basis for the conversion.

BACKGROUND OF INVENTION

It is desirable to store sampled data from an electronic control unit (ECU) in a vehicle to diagnose the operation of the vehicle. However, the amount of data that can be collected from the vehicle can easily be greater that the storage capacity of readily available data-collection systems.

SUMMARY OF THE INVENTION

Some known data-collection systems capture and store block or groups of data which in some instances are referred to as freeze-frame data which are stored as captured in the memory of the data-collection system. As vehicles get more complicated, the amount of data collected to diagnose a failure mode that includes data measured before and after an event often exceeds the storage capacity and/or storage speed of typical examples of these systems. However, it was recognized that vehicle conditions don't change drastically over a short period of time. That is, most of the data remains within some expected tolerance during the time-interval that the freeze-frame data is collected.

In general, the freeze-frame data is used to identify an anomaly in the signal so it is important to capture that moment. There are several compression methods already available for signal compression which can be used, but a compression method tailored for specific application can provide fast compression and better compression ratio. Described herein are a system and a method to reduce size of freeze-frame data captured or recorded from a vehicle. The freeze-frame data generally consists of or includes several software variables which are of different types, e.g. integer, floating point, etc. The system may be configured or programmed to carry out the steps of the method, where the method may include, but are not limited to, the steps of: determining a sample-size or count of freeze-frame data to be captured; capturing the count of sampled-data; finding an average-value of the sampled data for each variable captured in the freeze-frame; converting the sampled-data into a set of percentage-data using the average-value as a basis for the conversion; converting the percentage-data from time-domain to frequency domain by performing discrete cosine transformation (DCT) to produce DCT-data; converting the DCT-data from floating point to integer by rounding to nearest integer value to produce integer-data; encoding the integer-data using standard arithmetic coding or Huffman's coding to produce encoded-data; storing the encoded-data, a symbol-table that consists of a symbol-list and a symbol-count-list, and an average value list in a memory device.

The sample-size or count may correspond to a value of $2^n$ where n is between three (3) and eight (8).

The percentage-data may correspond to a percentage-difference relative to the average-value of each instance of the sample-data.

The average-value may be calculated either as overall average of said sample size for each software variable or running average as in for every sample read the value is averaged with previous average value and samples percentage-difference relative to the current average is calculated.

The floating to integer conversion may be to the nearest integer

The arithmetic coding may use a sixteen-bit encoding method which may be Huffman coding.

In accordance with one embodiment, a data-compression system for compressing and storing sampled data from an electronic control unit (ECU) in an automated vehicle is provided. The system includes an input and a controller. The input receives and samples a signal during a time-interval to provide a frame of sampled-data. The controller is in communication with the input. The controller is configured to capture the frame of sampled-data; determine an average-value of the sampled-data in the frame, and convert the sampled-data to percentage-data using the average-value as the basis for the conversion.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
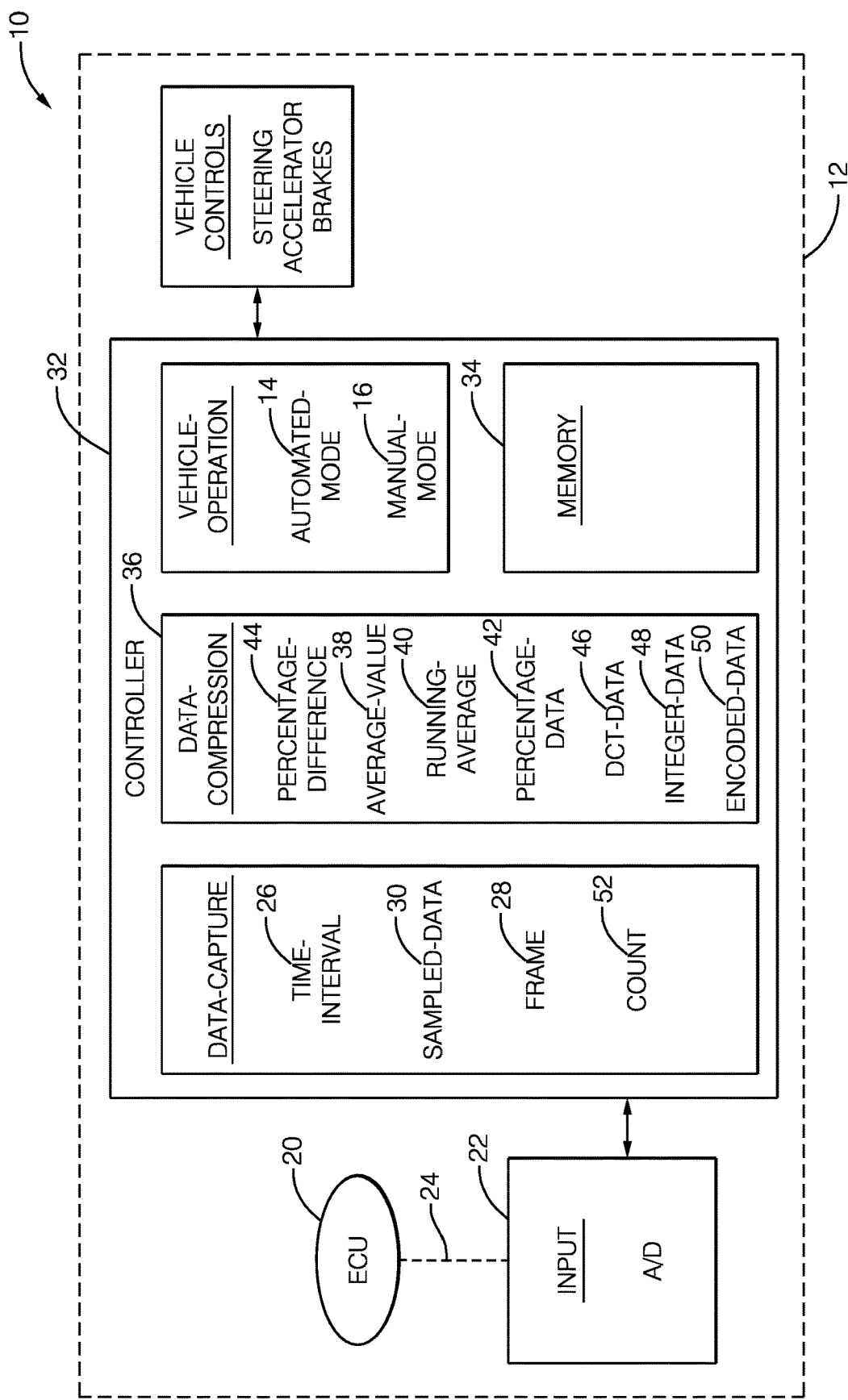
FIG. 1 is a diagram of a data-compression system in accordance with one embodiment.

FIG. 1 illustrates a non-limiting example of a data-compression system 10, hereafter referred to as the system 10. In general, the system 10 is suitable for compressing and storing sampled data from an electronic control unit 20 (ECU 20) in an automated vehicle, e.g. a host-vehicle 12. As used herein, the term automated vehicle may apply to instances when the host-vehicle 12 is being operated in an automated-mode 14, i.e. a fully autonomous mode, where a human-operator (not shown) of the host-vehicle 12 may do little more than designate a destination in order to operate the host-vehicle 12. However, full automation is not a requirement. It is contemplated that the teachings presented herein are useful when the host-vehicle 12 is operated in a manual-mode 16 where the degree or level of automation may be little more than providing an audible or visual warning to the human-operator who is generally in control of the steering, accelerator, and brakes of the host-vehicle 12. For example, the system 10 may merely assist the human-operator as needed to change lanes and/or avoid interference with and/or a collision with, for example, an object such as another-vehicle, a pedestrian, or a road sign.

The system 10 includes an input 22 that receives and samples a signal 24 during a time-interval 26 to provide a frame 28 of sampled-data 30. The signal 24 may be communicated to the input 22 by way of wires, optical-cable, or wireless communication, as will be recognized by those in the art. The signal 24 may be formed of or includes a single data-stream, or may include multiple different data-streams indicated of a variety of types of data from the ECU such as, but not limited to, ambient-temperature, fuel-injector-duty-cycle, throttle-position, mass-airflow-rate, and the like. The input 22 may include a commercially available analog-to-digital converter (A/D) with a selectable sample rate. The time-interval 26 may be preselected by a user (not show) of the system 10, or the time-interval 26 may be selected dynamically based on the content of the signal 24. As such, the time-interval 26 may be from a few milliseconds to several minutes depending on the interests of the user. As used herein, the frame 28 of the sampled-data 30 refers to that group or block of data that is received by the input 22 during the time-interval 26. As noted above, the frame 28 may contain a time-sampling of a single data-variable available from the ECU, or may contain a time-sampling of several distinct data-variables such as those noted above.

The system 10 includes a controller 32 in communication with the input 22. The controller 32 may include a processor (not specifically shown) such as a microprocessor or other control circuitry such as analog and/or digital control circuitry including an application specific integrated circuit (ASIC) for processing data as should be evident to those in the art. The controller 32 may include or may be in communication with a memory 34, including non-volatile memory, such as electrically erasable programmable read-only memory (EEPROM) for storing one or more routines, thresholds, and captured data. The one or more routines may be executed by the processor to perform steps for capturing and processing data from the ECU 20 based on signals received by the controller 32 from the ECU and/or a user-interface (not shown) such as a keyboard and/or a display, optionally a touch-sensitive display as will be recognized by those in the art.

The controller 32 is configured or programmed to capture the frame 28 of the sampled-data 30 which may be by way of storing the frame 28 in the memory 34, or a more temporary fast input/output type of memory such as random-access-memory (RAM) that may be integrated in the aforementioned processor. Temporary storage in the RAM maybe preferable as subsequent steps or processes performed by the controller 32 to perform a data-compressing 36 of the frame 28 (of the sampled-data 30) will advantageously result in a smaller amount of the memory 34 being occupied, as will be explained in more detail below.

As part of the data-compression 36, the controller 32 determines an average-value 38 of the sampled-data 30 in the frame 28. By way of example and not limitation, the frame 28 may consist of two-hundred-fifty-six (256) samples of fifteen (15) different variables captured from the ECU 20 during the time-interval 26. Accordingly, 15 distinct values of the average-value 38 are calculated for each of the 15 different variables by adding up all 256 samples for each variable and then dividing by 256. This example of how the average-value 38 is calculated is sometimes called a simple average.

Alternatively, the average-value 38 may be characterized as a running-average 40 of a count 52 of prior instances of the sampled-data 30. For example, the average-value 38 for a variable may be based on an average of the latest value of the variable and one or more of the most recent values. That is, the running-average 40 for a variable may be the average of the two most recent instances of the sampled-data 30. The advantage of using the running-average 40 is that the data can be compressed as describe below in an 'on the fly' manner. In contrast, a disadvantage of the simple-average describe above is that all of the sampled-data 30 must be temporarily stored until the average-value 38 can be calculated However, a disadvantage of the running average 40 is that the each data stored may be compressed using a different value of the average-value 38.

The next step of the data-compression 36 is to convert the sampled-data 30 to percentage-data 42 using the average-value 38 as the basis for the conversion. For example, each instance of the sampled-data 30 for a particular variable may be divided by the average-value 38 associated with that instance of the sampled-data 30 in the frame 28. As such, the percentage-data 42 corresponds to a percentage-difference 44 relative to the average-value 38 of each instance of the sampled-data 30. Note that by performing this step the variable values now fluctuate around zero since the average-value 38 has been 'removed'.

Further compressing of data may be realized if the controller 32 is further configured to convert the percentage-data 42 to discrete cosine transform-data 46 (DCT-data 46) by applying a discrete cosine transform (DCT) to the percentage-data 42, convert the DCT-data 46 to integer-data 48, and encode the integer-data using standard arithmetic coding or Huffman's coding to produce encoded-data 50.

Once the selected steps of the data-compression 36 is complete, the controller 32 may store in the memory 34 data that corresponds to, or is, the percentage-data 42 (or the encoded-data 50 if subsequent processing of the percentage-data 42 is selected), the average-value 38, a symbol-table that consists of a symbol-list and a symbol-count-list, i.e. the the count 52 of instances of the sampled-data 30 in the frame 28.

As will be recognized by those in the art, the steps taken to perform the data-compression 36 may be reversed to de-compress the data stored in the memory 34 so that the data that corresponds to or matches the sampled-data 30 can be recovered.

Figure 2:
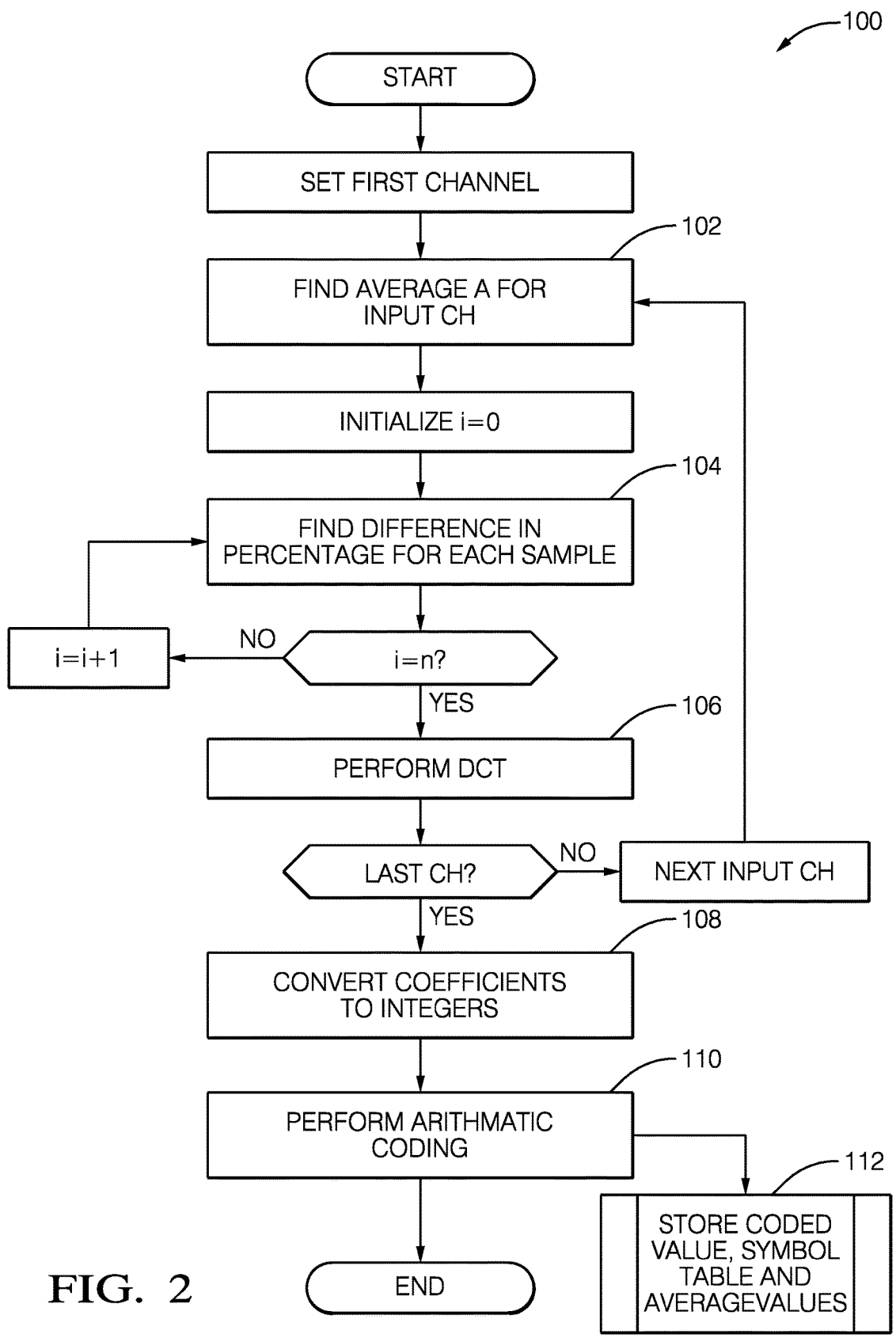
FIG. 2 is flowchart of a method carried out by the system of FIG. 1 in accordance with one embodiment.

FIG. 2 illustrates a non-limiting example of a method 100 to perform the data-compression 36. For each channel at the input 22, i.e. for each variable selected for collection from the ECU 20, the average-value 38 of the sampled-data 30 in the frame 28 for the variable selected is determined in step 102. Once the average-value 38 known, the method 100 proceeds to determine the percentage-difference 44 for each instance of the sampled-data 30 in step 104, and this step is repeated 'n' times where 'n' is equal to the count 52. In optional step 106, the method 100 performs the discrete cosine transformation (DCT) to provide the DCT-data 46. In optional step 108 the DCT-data is converted into the integer-data 48. In optional step 110 the integer-data 48 is converted into the encoded-data by performing arithmetic coding. In step 112, the compressed-data, e.g. the encoded-data 50 or the percentage-data 42, and the aforementioned symbol-table, and the average-value 38 for each of the variables are stored in the memory 34.

Figure 3:
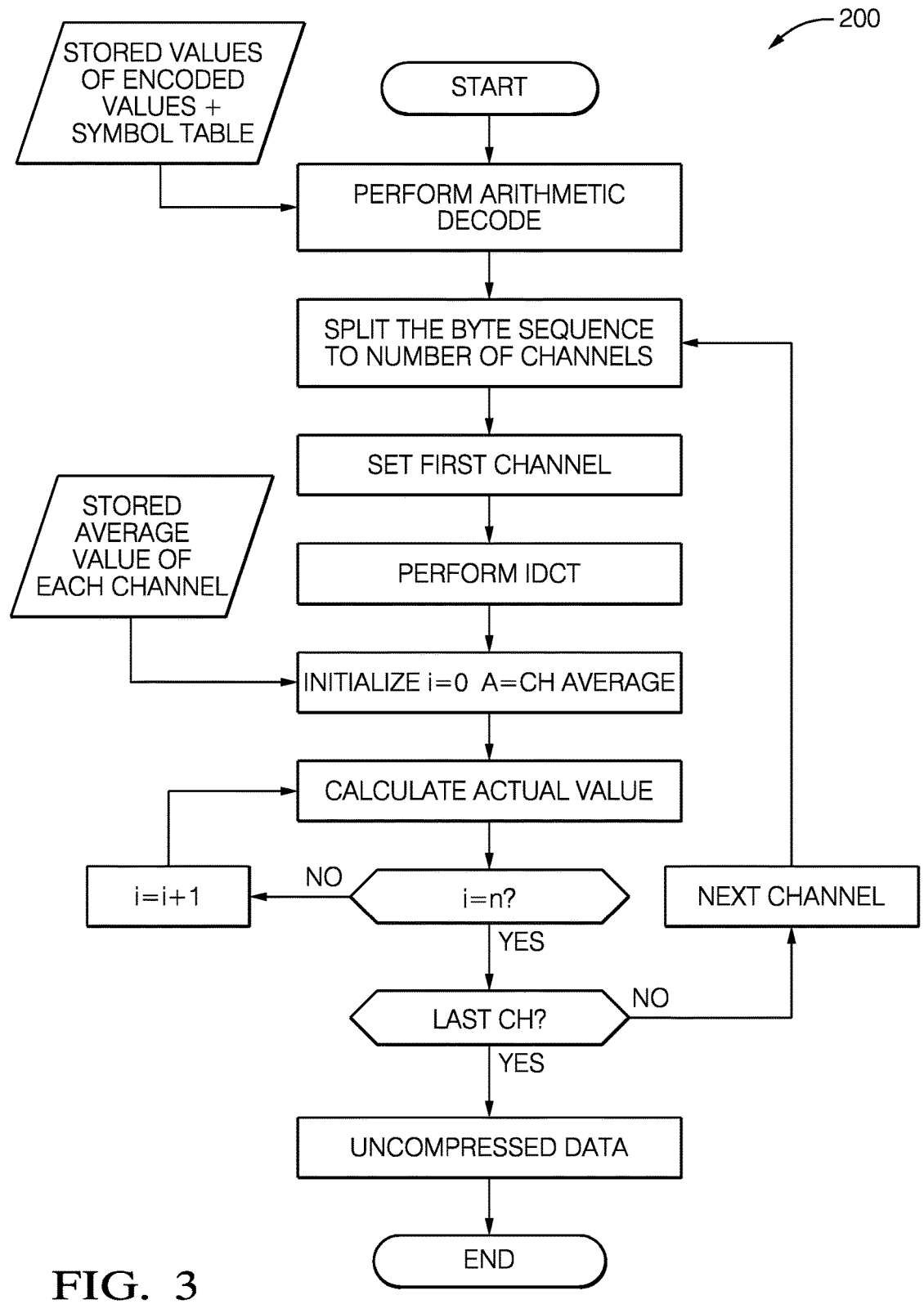
FIG. 3 is flowchart of a method carried out by the system of FIG. 1 in accordance with one embodiment.

FIG. 3 illustrates a non-limiting example of a method 200 for decompressing that performs steps that undo the compression of data performed by the method 100.

Accordingly, a data-compression system (the system 10), a controller 32 for the system 10, and a method 100, 200 of operating the system 10 is provided. By determining the percentage-difference 44 of each instance of the sampled-data 30, the percentage-data 42 can be stored in the memory 34, or further compression steps can be performed before data is stored in the memory 34.

While this invention has been described in terms of the preferred embodiments thereof, it is not intended to be so limited, but rather only to the extent set forth in the claims that follow.

I claim:

1. A data-compression system for compressing and storing sampled data from an electronic control unit (ECU) in an automated vehicle, said system comprising:
an input that receives and samples a signal during a time-interval to provide a frame of sampled-data; and
a controller in communication with the input, said controller configured to capture the frame of sampled-data; determine an average-value of the sampled-data in the frame, and convert the sampled-data to percentage-data using the average-value as the basis for the conversion.

2. The system in accordance with claim 1, wherein the percentage-data corresponds to a percentage-difference relative to the average-value of each instance of the sample-data.

3. The system in accordance with claim 1, wherein the controller is further configured to convert the percentage-data to discrete cosine transform-data (DCT-data) by applying a discrete cosine transform (DCT) to the percentage-data, convert the DCT-data to integer-data, and encode the integer-data using standard arithmetic coding to produce encoded-data.

4. The system in accordance with claim 3, wherein the controller is further configured to store the encoded-data, the average-value, and a count of instances of the sampled-data in the frame.

5. The system in accordance with claim 1, wherein the average-value is characterized as a running-average of a count of prior instances of the sampled-data.

6. A data-compression system for compressing and storing sampled data from an electronic control unit (ECU), said system comprising:
an input that receives and samples a signal during a time-interval to provide a frame of sampled-data; and
a controller in communication with the input, said controller configured to capture the frame of sampled-data; determine an average-value of the sampled-data in the frame, and convert the sampled-data to percentage-data using the average-value as the basis for the conversion.

7. The system in accordance with claim 6, wherein the percentage-data corresponds to a percentage-difference relative to the average-value of each instance of the sample-data.

8. The system in accordance with claim 6, wherein the controller is further configured to convert the percentage-data to discrete cosine transform-data (DCT-data) by applying a discrete cosine transform (DCT) to the percentage-data, convert the DCT-data to integer-data, and encode the integer-data using standard arithmetic coding to produce encoded-data.

9. The system in accordance with claim 8, wherein the controller is further configured to store the encoded-data, the average-value, and a count of instances of the sampled-data in the frame.

10. The system in accordance with claim 6, wherein the average-value is characterized as a running-average of a count of prior instances of the sampled-data.

* * * * *